United States Patent [19]

Williams

[11] 4,208,729

[45] Jun. 17, 1980

[54] AUTOMATIC DATA RESTORE APPARATUS FOR MNOS TEMPORARY STORE MEMORY

[75] Inventor: David W. Williams, Baltimore, Md.

[73] Assignee: The United States of America as represented by the Secretary of the Air Force, Washington, D.C.

[21] Appl. No.: 18,697

[22] Filed: Mar. 8, 1979

[51] Int. Cl.² ............................................. G11C 11/40
[52] U.S. Cl. .................................. 365/184; 365/182; 365/228; 307/238
[58] Field of Search ............... 365/174, 182, 184, 228; 307/238, 279

[56] References Cited

U.S. PATENT DOCUMENTS 4,149,270  4/1979  Cricchi et al. ........................ 365/184

Primary Examiner—Terrell W. Fears
Attorney, Agent, or Firm—Joseph E. Rusz; William Stepanishen

[57] ABSTRACT

An automatic data restore apparatus utilizing a pair of memory transistors in conjunction with a dual node detection circuit driving two cross-coupled NOR gates to provide a temporary store memory unit.

5 Claims, 1 Drawing Figure

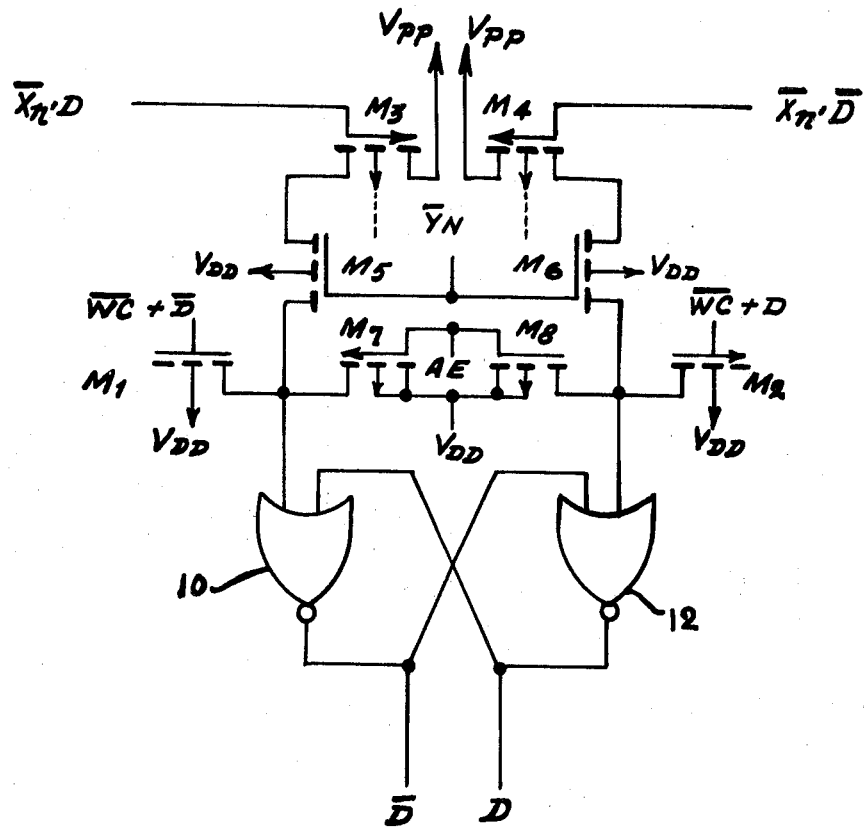

AUTOMATIC DATA RESTORE APPARATUS FOR MNOS TEMPORARY STORE MEMORY

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to storage circuits, and in particular to an automatic data restore apparatus for a temporary store memory unit.

In the prior art metal nitride oxide semiconductor (MNOS) memories with short cycle times are being developed for application in various systems. One such type memory is known as a Temporary Store Memory (TSM) and is used as a RAM with write cycle times less than 2 microseconds. In such an application the MNOS transistors which generally comprise the nonvolatile storage are shifted in threshold over a region of a few volts and are never shifted to the full extent (saturated)) either most positive or most negative due to the short write pulses that are involved. Saturation of the memory transistors is prevented so that subsequent write cycles can reverse the data if required. However, during a write operation the contents of the memory are read and compared to the input data and if different the new input data is written. If the new data is the same rewriting is inhibited. If may also be desirable to detect the data that may be marginal. Such data is the stored data that is the same as the input data but is near the end of its retention period. In this case rewriting or restoring the data is desired. It is important that the means of implementing this automatic restore feature operate over the full range of environmental conditions (such as temperature and radiation) to which the device may be subjected.

One such prior art method which has been utilized, requires the adding of a current to the circuit which detects the data in such a way that it opposes the states of the memory device. Two memory transistors per bit are used and are written to opposite states. One is shifted slightly positive, the other is slightly negative. Each transistor drives a node of a flip flop which is used to detect the data. If the difference between the two memory devices is above some minimum, the current they supply will overcome this added current, and stored data will be detected and the writing will be inhibited. If, however, the difference is below the minimum, the complement of the stored data will be detected and rewriting or restoring of the data will occur. This technique has been tried using computer simulation and can be made to work under a given set of conditions such as pre-radiation and room temperature. However, difficulty is encountered when the transistor parameters are changed to simulate the post radiation 125° C. case. This occurs because the MOS FETS used to control the added current do not track the memory transistors with respect to temperature and radiation effects. The present circuit overcomes the prior art difficulties by providing an automatic data restore apparatus.

SUMMARY OF THE INVENTION

The present invention utilizes the read-compare data from a temporary store memory in conjunction with a data restore network which controls the capacitive loading in the two nodes of the memory detection circuit. When the memory devices are in a marginal state, the capacitance which is added to the detection circuit will cause a state opposite to that previously stored to be detected. Since the comparator in the temporary store memory provides a command to write if the data input is not equal to the data detected, the previously stored data will be rewritten. If the memory devices are in a strong state, the added capacitance will not influence the state detected, and rewriting will not occur if the detected data equals the input data.

It is one object of the present invention, therefore to provide an improved automatic data restore apparatus MNOS temporary store memory unit.

It is another object of the invention to provide an improved automatic data restore apparatus which is insensitive to the adverse effects of temperature and radiation.

It is still another object of the invention to provide an improved automatic data restore apparatus having a dual node detection circuit to detect marginal data.

It is yet another object of the invention to provide an improved automatic data restore apparatus having improved performance characteristics.

These and other advantages, objects and features of the invention will become more apparent after considering the following description taken in conjunction with the illustrative embodiment in the accompanying drawings.

BRIEF DESCRIPTION OF THE DRAWING

The FIGURE is a schematic diagram of the automatic data restore apparatus according to the present invention.

DESCRIPTION OF THE PREFERRED EMBODIMENT

Referring now to the FIGURE, there is shown an automatic data restore apparatus utilizing a pair of memory transistors, M3, M4 to receive respectively input data and its complement. The outputs from the memory transistors, M3, M4, are connected through column address selection transistors M5, M6 to a detection circuit. The detection circuit is comprised of two cross-coupled NOR gates 10, 12. A pair of MOS capacitors M1, M2 (varactors) which are similar to the transistors used except one diffusion is omitted, are respectively connected to the input to NOR gates 10, 12. When the voltage applied to the gate of either of these capacitors is below threshold, the capacitor is in a low capacitance state; when threshold is exceeded, it is in a high capacitance state. During a normal READ operation both capacitors are off (low capacitance) and thus they have no effect. The reset transistor M7 is connected to the input of NOR gate 10 while reset transistor M8 is connected to the input gate of NOR gate 12. The output from the detection circuit provides a command to write or not write according to the comparison results of the detection circuit.

The automatic data restore apparatus operates in the following manner. During a write cycle, one of the capacitors M1 or M2 comes on as a function of the input data. If, for example, the memory transistor M3 contains DATA and memory transistor M4 contains $\overline{\text{DATA}}$ (DATA COMPLEMENT) and the input data equals stored data, the capacitor M1 is turned on such that it adds additional capacitive loading to the source of the memory transistor supplying the most current. The other capacitor is held off. The capacitor value may be adjusted so that if a sufficient difference exists between the memory transistors, this capacitive inbalance will be overcome, stored data will thus be detected, and writing will be inhibited. If however, the difference between the two memory transistors is below a minimum, the complement of the stored data will be detected and the data will be restored. The capacitor values are essentially immune to radiation and temperature as are the memory transistors themselves. Computer simulation has been performed over a full range of temperature and radiation effects to insure that the present automatic data restore apparatus is immune to the adverse effects of temperature and radiation.

Although the invention has been described with reference to a particular embodiment, it will be understood to those skilled in the art that the invention is capable of a variety of alternative embodiments within the spirit and scope of the appended claims.

What is claimed is:

1. An automatic data restore apparatus for a MNOS temporary store memory unit comprising in combination:

a first memory transistor to receive input data at its input, said first memory transistor temporarily holding said input data and then applying same to its output, a second memory transistor to receive stored data at its input, said second memory transistor temporarily holding said stored data and then applying same to its output, a first capacitor connected to said output of said first memory transistor, said first capacitor being variable, said first capacitor's capacitance being increased proportional to the input data, a second capacitor connected to said output of said second memory transistor, said second capacitor being variable, said second capacitor's capacitance being increased proportional to said stored data, and, a detection unit connected to the outputs of said first and second memory transistor to receive input data and stored data, said detection unit comparing the outputs from said first and second memory transistor to determine a difference therebetween, said detection unit comparing said difference to a minimum level, said detector unit providing a command to write new data if said difference is below said minimum level which indicates that said stored data is not detected, said detector unit providing an inhibit command if said difference is above said minimum level which indicates that said stored data is detected.

2. The apparatus as described in claim 1 wherein said detection circuit comprises in combination a pair of cross-coupled NOR gates, the input of one NOR gate being connected to the output of said first memory transistor and the input of the other NOR gate being connected to the output of said second memory transistor.

3. The apparatus as described in claim 1 further including a first and second column address selection transistor, said first column address selection transistor being connected between said first memory transistor and said detection unit, said second column address selection transistor being connected between said second memory transistor and said detection unit.

4. The apparatus as described in claim 1 wherein said first and second capacitors are substantially the same as said first and second memory transistors except that one diffusion is omitted.

5. The apparatus as described in claim 1 which, during a normal read operation, said first and second capacitors are both in a low capacitance state.

* * * * *